(12) United States Patent
Hu

(10) Patent No.: US 6,797,568 B1
(45) Date of Patent: Sep. 28, 2004

(54) FLASH TECHNOLOGY TRANSISTORS AND METHODS FOR FORMING THE SAME

(75) Inventor: YongZhong Hu, Cupertino, CA (US)

(73) Assignee: Lattice Semiconductor Corp., Hillsboro, OR (US)

( * ) Notice: Subject to any disclaimer, the term of this patent is extended or adjusted under 35 U.S.C. 154(b) by 0 days.

(21) Appl. No.: 10/302,439

(22) Filed: Nov. 21, 2002

(51) Int. Cl.[7] .............................................. H01L 21/336
(52) U.S. Cl. ...................... 438/266; 438/257; 438/258; 257/314; 257/315; 257/324; 257/326
(58) Field of Search ............................. 257/314, 315, 257/316, 324, 326; 438/257, 258, 266, 279, 283

(56) References Cited

U.S. PATENT DOCUMENTS

| | | | | |
|---|---|---|---|---|
| 5,888,869 A | * | 3/1999 | Cho et al. | 438/258 |
| 6,096,604 A | * | 8/2000 | Cha et al. | 438/259 |
| 6,372,577 B1 | * | 4/2002 | Fang | 438/258 |
| 6,410,387 B1 | * | 6/2002 | Cappelletti et al. | 438/257 |
| 6,627,928 B2 | * | 9/2003 | Peschiaroli et al. | 257/288 |

* cited by examiner

Primary Examiner—Van Thu Nguyen
Assistant Examiner—Christian D. Wilson

(57) ABSTRACT

High voltage (HV), single polysilicon gate NMOS and PMOS transistors in double polysilicon stacked gate flash technology and methods for making the same are described. Specifically, the methods provide for the formation of (and devices comprise) high voltage polysilicon 1 and polysilicon 2 transistors (NMOS and PMOS) in double polysilicon stacked gate flash technology. Different types of transistors (e.g., HV P1 NMOS, HV P1 PMOS, HV P2 NMOS, HV P2 PMOS, LV P1 NMOS, LV P1 PMOS, LV P2 NMOS, LV P2 PMOS) are formed along with a stacked-gate double-poly transistor, thereby providing versatility in flash technology device design. The polysilicon 1 transistors may be salicided without adding to the complexity of the double poly stacked gate fabrication process. In addition, the stacked gate device may include polysilicon 2 only transistors.

10 Claims, 5 Drawing Sheets

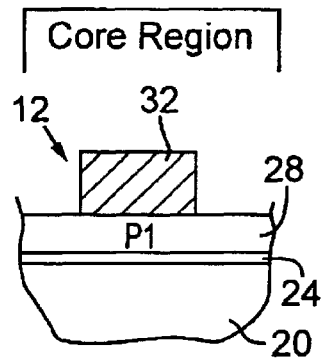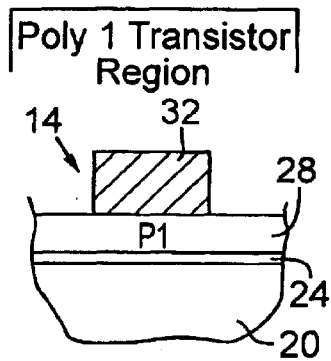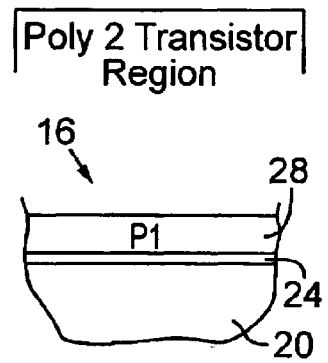
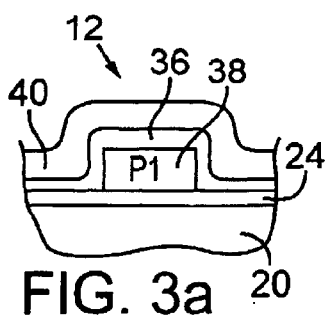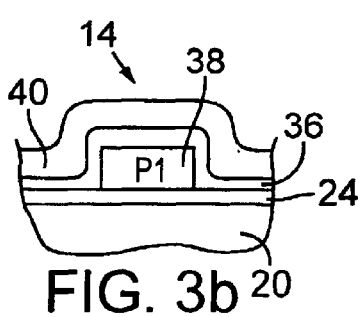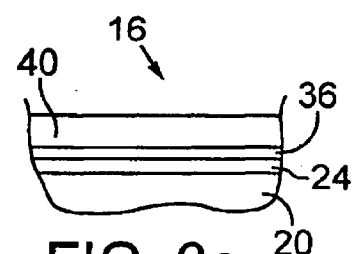
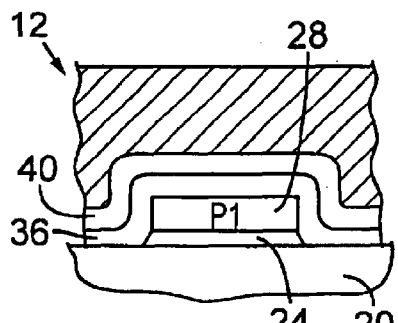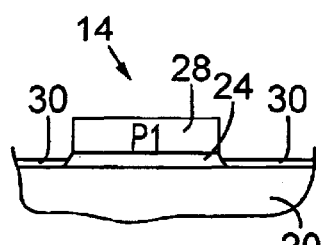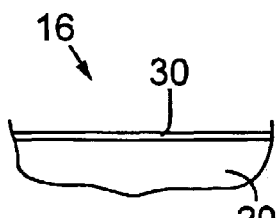

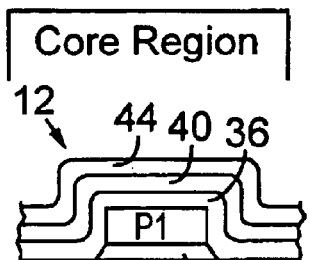
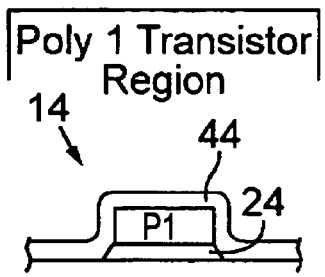
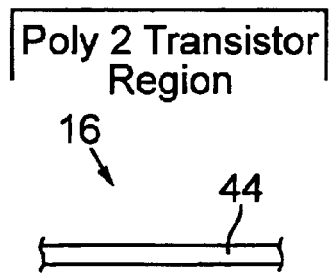
FIG. 5a     FIG. 5b     FIG. 5c
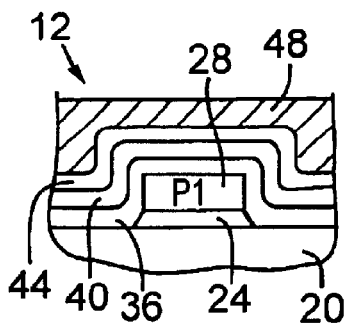
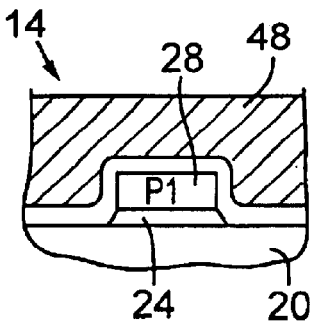
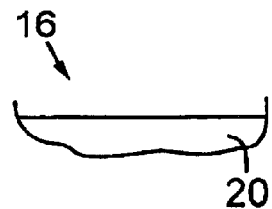
FIG. 6a     FIG. 6b     FIG. 6c

FLASH TECHNOLOGY TRANSISTORS AND METHODS FOR FORMING THE SAME

FIELD

The invention relates to fabrication of integrated circuit memory devices. More specifically, the invention relates to forming transistors in flash technology and devices formed thereby.

BACKGROUND

The semiconductor community faces increasingly difficult challenges as it moves into production of continually smaller semiconductor devices. Memory cell designs for typical semiconductor memory devices must be made more durable, smaller (i.e., scalable), cost effective to manufacture, faster in reading and writing and capable of operating at low or high voltages. Given the considerable commercial importance placed on small memory cell size and reliability of such devices, new fabrication processes are continually needed.

In general, memory devices such as a flash electrically erasable programmable read only memory (EEPROM) are known. EEPROMs are a class of nonvolatile memory devices that are programmed by hot electron injection and erased by Fowler-Nordheim tunneling. Each memory cell is formed on a semiconductor substrate (i.e., a silicon die or chip), having a heavily doped drain region and a source region embedded therein. A channel region separates the drain region and the source region.

The memory cell further includes a multi-layer structure, commonly referred to as a "stacked gate" structure or word line. The stacked gate structure typically includes: a thin gate dielectric or tunnel oxidation layer formed on the surface of substrate overlying the channel region; a first polysilicon (poly 1) floating gate overlying the tunnel oxidation; an interpoly dielectric overlying the floating gate; and a second polysilicon (poly 2) control gate overlying the interpoly dielectric layer. Additional layers may be formed by salicidation on the control gate polysilicon. A plurality of flash memory cells may be formed on a single substrate.

Conventional flash memory devices also include peripheral portions, which typically include input/output circuitry for selectively addressing individual memory cells. Clearly, each memory device requires multiple transistors. Such transistors need not only be relatively small but the fabrication process cost effective, preferably simple and resulting in reliable devices. In particular, conventional flash technology forms high voltage (HV) peripheral transistors using only the second polysilicon gate (i.e., the control gate polysilicon-poly 2) or an unsalicided poly 1 gate. This conventional approach limits the number of devices available for circuit design and complicates the processing steps necessary for reliable HV device performance. Although high voltage poly 1 gate transistors have been fabricated in flash technology, the currently available methods form only unsalicided devices due to processing limitations. Specifically, only unsalicided poly 1 gate transistors have been formed to date for flash technology devices due to the unacceptable thinning of poly 1 from repeated oxidation and etching of subsequent oxides formed, as well as the low etch selectivity between oxide and polysilicon.

SUMMARY

Presently disclosed are high voltage (HV) (i.e., capable of operating at or greater than about 5.0 V), memory devices including, e.g., single polysilicon (poly) gate NMOS and PMOS transistors in double polysilicon stacked gate flash technology and methods for fabricating the same. Specifically, disclosed are double poly stacked gate flash memory devices having high voltage poly 1 transistors and poly 2 transistors (NMOS and PMOS) in double polysilicon stacked gate flash technology. Certain embodiments of the methods allow for formation of different types of transistors (e.g., HV P1 NMOS, HV P1 PMOS, HV P2 NMOS, HV P2 PMOS, LV P1 NMOS, LV P1 PMOS, LV P2 NMOS, LV P2 PMOS) providing versatility in flash device design. Certain embodiments of the single poly transistors may be salicided without adding to the complexity of the double poly stacked gate fabrication process. Certain embodiments of the methods overcome the current limitations of fabricating high voltage devices using only poly 2 gates or fabricating high voltage poly 1 transistors that are unsalicided, in double poly stacked gate flash technology.

For example, in an embodiment of the fabrication process for forming a flash memory cell, the method comprises providing a substrate; forming a double polysilicon stacked gate device on the substrate, including a first polysilicon layer and a second polysilicon layer; formning a high voltage NMOS or PMOS first transistor on the substrate, the high voltage NMOS or PMOS first transistor including a gate formed by the first polysilicon layer; forming a high voltage or low voltage NMOS or PMOS second transistor on the substrate, the NMOS or PMOS second transistor including a gate formed by the second polysilicon layer; and saliciding the double polysilicon stacked gate device, the high voltage NMOS or PMOS first transistor, and the high voltage or low voltage second NMOS or PMOS transistor.

Certain embodiments of the disclosed double poly stacked gate flash technology memory devices comprise single poly 1 gate NMOS and PMOS transistors. Specifically, certain embodiments of the devices comprise high voltage peripheral poly 1 transistors in double stacked gate devices and/or salicided poly 1 transistors in double stacked gate devices. "Peripheral" is used herein as relative to "CORE." A CORE device refers to a stacked-gate transistor, while peripheral devices refer to regular single poly transistors (e.g., P1 or P2, LV or HV, etc.). As is known to those persons of ordinary skill in the art, salicided poly 1 devices provide lower S/D and parasitic resistence, higher drive current and thus, provide superior performing transistors.

BRIEF DESCRIPTION OF THE DRAWINGS

FIG. 1b illustrates a polysilicon 1 transistor device region formed during fabrication of the polysilicon stacked gate flash memory device shown in FIG. 1a.

FIG. 1c illustrates a polysilicon 2 transistor device region formed during fabrication of a polysilicon stacked gate flash memory device shown in FIG. 1a.

FIGS. 2a–2c illustrate tunnel oxidation and polysilicon 1 deposition in the fabrication of double polysilicon stacked gate, polysilicon 1 transistor, and polysilicon 2 transistor regions of a flash memory device.

FIGS. 3a–3c illustrate a polysilicon etch, HTO oxide deposition and nitride deposition in the fabrication of double polysilicon stacked gate, polysilicon 1 transistor, and polysilicon 2 transistor regions of a flash memory device.

FIGS. 4a–4c illustrate ONO mask formation and etching in the fabrication of double polysilicon stacked gate, polysilicon 1 transistor, and polysilicon 2 transistor regions of a flash memory device.

FIGS. 5a–5c illustrate a second HTO deposition in the fabrication of double polysilicon stacked gate, polysilicon 1 transistor, and polysilicon 2 transistor regions of a flash memory device.

FIGS. 6a–6c illustrate a GOM mask and etching in the fabrication of double polysilicon stacked gate, polysilicon 1 transistor, and polysilicon 2 transistor regions of a flash memory device.

Detailed Description

Figure 1A:
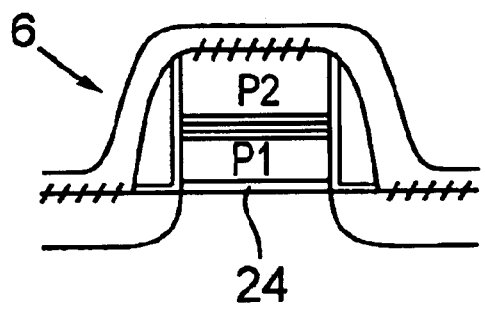
FIG. 1a illustrates a double polysilicon stacked gate region of a flash memory device.
Figure 1B:
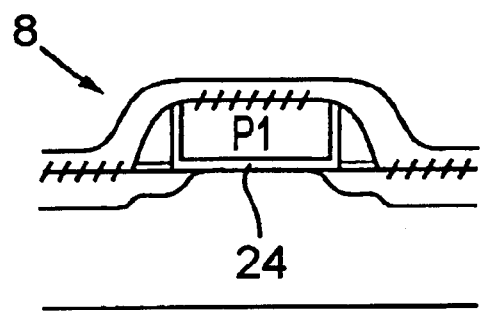
Figure 1C:
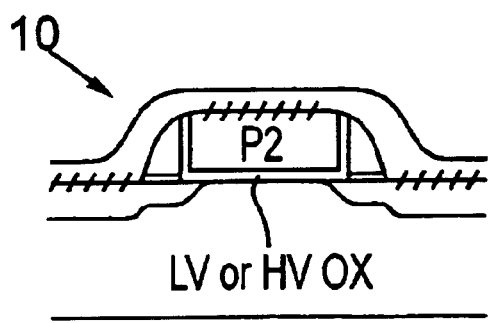

Disclosed are high voltage, polysilicon 1 (poly 1) gate NMOS and PMOS transistors with polysilicon 2 (poly 2) gate NMOS or PMOS transistors, both formed in a double poly stacked gate flash memory technology device and methods for making the same. As shown in FIGS. 1a–1c, certain embodiments of the present devices and methods form poly 1 transistors 8 and polysilicon 2 (poly 2) transistors 10 during fabrication of a double poly stacked gate 6 flash memory device. The poly 1 gate may be salicided or unsalicided.

All depositions, etches, implants, etc. described herein may be performed by conventional techniques (unless otherwise stated) as known to those persons skilled in the art. Likewise, as is understood by those persons skilled in the art, materials forming components of the described structures or used for fabrication of the same are not limited to those explicitly cited but may comprise any suitable material for the function performed or structure formed.

As shown in FIGS. 2a–2c, certain embodiments of the methods disclosed begin with tunnel oxidation, a poly 1 deposition on a wafer substrate 20 and formation of a poly 1 mask. More specifically, a wafer or substrate 20 of the flash memory device may comprise any suitable material that may serve to form substrates for semiconductor devices. Useful substrate materials include, but are not limited to, doped or undoped silicon, silicon-on-insulator (SOI), and gallium arsenide. The substrate 20 may be, e.g., a p-type bulk or epitaxy wafer. More particularly, the double polysilicon stacked gate device 6 (FIG. 1a) may be formed on a p-type substrate or on a p-well with deep n-well surrounding and underneath the p-well.

The single polysilicon (poly 1) transistor 8 (FIG. 1b) may be formed to comprise a NMOS transistor on a p-type substrate or p-well or may comprise a PMOS transistor on an n-well or a deep n-well. The poly 2 transistor 10 (FIG. 1c) may comprise a LV or HV, PMOS or NMOS device formed on the same substrate or well on the poly 1 transistor 8.

Figure 9A:
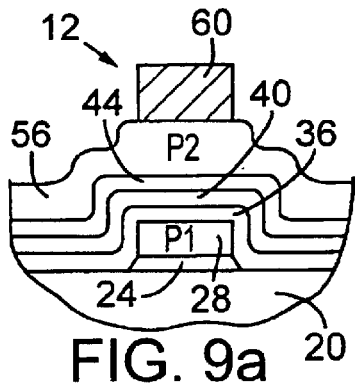
FIGS. 9a–9c illustrate a stacked gate mask in the fabrication of double polysilicon stacked gate, polysilicon 1 transistor, and polysilicon 2 transistor regions of a flash memory device.
Figure 9B:
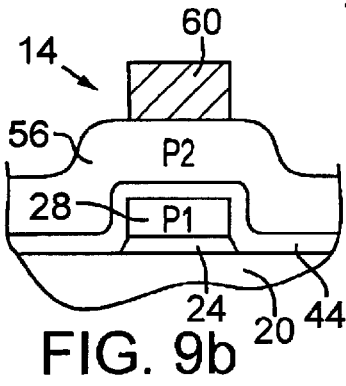
Figure 10A:
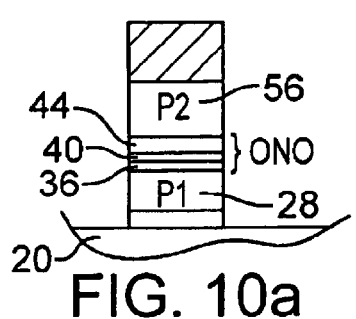
FIGS. 10a–10c illustrate a stacked gate etch process in the fabrication of double polysilicon stacked gate, polysilicon 1 transistor, and polysilicon 2 transistor regions of a flash memory device.
Figure 10B:
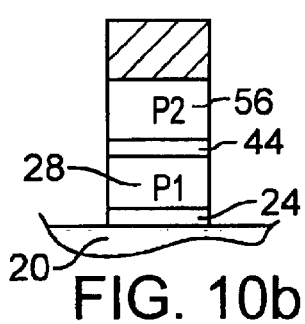

A thin layer of tunnel oxide 24 is formed on the substrate 20 (FIGS. 2a–2c). A first polysilicon layer (poly 1) 28 is deposited over the tunnel oxidation layer 24. The poly 1 layer 28 may have a thickness of from about 800 to about 2000 Å or whatever thickness is suitable to facilitate the proposed integration and formation of the poly 1 transistors. For the double poly stacked gate region 12 (FIG. 2a) and the poly 1 transistor region 14 (FIG. 2b) of the double poly stacked gate flash memory device to be formed, a poly mask 32 is deposited and patterned. A poly mask is not formed on the peripheral poly 2 transistor region 16 (FIG. 2c). The gate width (i.e., the width of poly 1 remaining following etching of the poly 1 layer 28 described below) of the poly 1 transistor region 14 is defined by the length of the poly mask 32. At this point the poly 1 gate width may be wider than the resulting poly 1 transistor gate length because the final poly 1 transistor gate length is defined during the stacked gate etch steps (FIGS. 9b and 10b).

Referring to FIGS. 3a–3c, the poly 1 layer 28 is patterned and the poly mask 32 is removed. Thus, the double poly stacked gate region 12 and the poly 1 transistor region 14 each have a portion 38 of the poly 1 layer 28 remaining (FIGS. 2a and 2b). The entire poly 1 layer 28 (FIG. 2c) is removed from the peripheral poly 2 transistor region 16. The device is treated with a high-temperature oxide (HTO) deposition to form insulation layer 36 (for example, a thin oxide of from about 20 Å to about 100 Å in thickness) (FIGS. 3a–3c). Although an HTO layer is described herein, any suitable insulating material capable of functioning as an insulator or a dielectric in a semiconductor device may be used to form insulating layer 36. Exemplary insulating materials to form the first insulation layer 36 include, but are not limited to silicon dioxide, tetraethyl orthosilicate (TEOS) and oxides. Alternatively, plural-insulating materials may be employed to form insulation layer 36. A silicon nitride layer 40 of, e.g., from about 20 Å to about 100 Å in thickness is deposited over the insulation layer 36. Other high-dielectric constant insulator materials may be used in conjunction with or as a substitute for the silicon nitride layer 40, e.g., silicon oxynitride or tantalum oxide.

Referring to FIG. 4a, an oxide-nitride-oxide (ONO) mask is formed on the nitride layer 40 over the poly 1 portion 28 of the double poly stacked gate region 12. The ONO mask is not formed over the poly 1 or poly 2 transistor regions 14, 16 (as shown in FIGS. 4b and 4c). The nitride layer 40 and insulation layer 36 are removed from the poly 1 transistor region 14 and the poly 2 transistor region 16 (as shown in FIGS. 4b and 4c). Only the nitride layer 40 and insulation layer 36 remain on the double poly stacked gate region 12 over the remaining portion of the poly 1 layer 28 (FIG. 4a). Thus, the poly 1 transistor region 14 shown comprises, at this point, the substrate 20, a portion of the tunnel oxide layer 24, the poly 1 layer 28 and residual oxide 30 (FIG. 4b). The poly 2 transistor region 16 shown comprises, at this point, only the substrate 20 and residual oxides 30 after the ONO etch (FIG. 4c).

The ONO mask is removed from the double poly stacked gate region 12 and the device is cleaned. An RCA cleaning step may be performed to remove organic contaminants (such as photoresist particles or polymeric debris) from the device surface to remove any ionic or heavy metal contaminants that may be present. A HF or BOE dip may be performed to remove residual oxide (e.g., layer 30) from the device surface, especially in regions 14 and 16. A second HTO layer 44 is formed over all three regions 12, 14, and 16, at a thickness of, e.g., from about 50 Å to about 80 Å (FIGS. 5a–5c).

Referring to FIGS. 6a–6c, a gate oxide mask (GOM) 48 is formed over the double poly stacked gate region 12 (FIG. 6a) and the poly 1 transistor region 14 (FIG. 6b) to define the peripheral poly 2 transistor region 16 so that the poly 2 devices have different gate oxide thicknesses as compared to the poly 1 devices. The GOM 48 step protects the poly stacked gate region 12 (FIG. 6a) and the poly 1 transistor region 14 (FIG. 6b) and opens the poly 2 transistor region 16 to remove the HTO layer 44 (FIG. 6c). The HTO layer 44 over poly 1 portion 28 of the poly 1 transistor region 14 remains to protect the poly 1 portion 28 later in the process when the device goes through peripheral gate oxidation steps (described below).

Figure 7A:
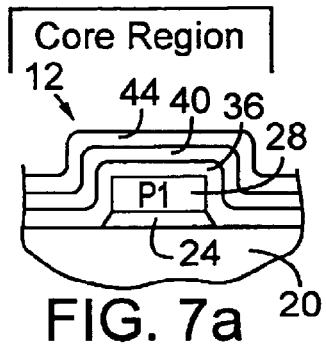
FIGS. 7a–7c illustrate LV gate oxidation in the fabrication of double polysilicon stacked gate, polysilicon 1 transistor, and polysilicon 2 transistor regions of a flash memory device.
Figure 7B:
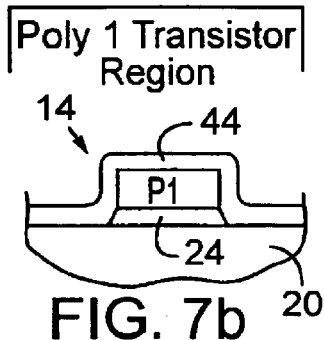
Figure 7C:
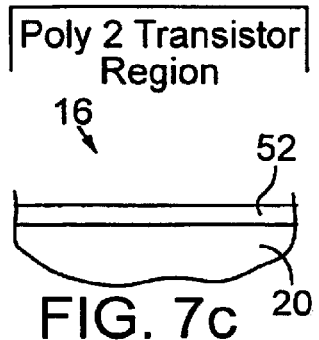

Referring to FIGS. 7a–7c, a low voltage (LV) gate oxidation step is performed. This step grows a LV dry oxide layer 52 (e.g., from about 25 Å to about 50 Å) (FIG. 7c) for low voltage poly 2 transistors while the step densifies the HTO layer 44 over poly 1 portion 28 of the poly 1 transistor region 14 (FIG. 7b). More particularly, the HTO layer 44 may be deposited at a relatively low temperature (see below, e.g., 750° C.) while the dry oxidation is performed (the dry oxide layer 52 is deposited) at from about 850° C. to about 1100° C. or a sufficient temperature to density the HTO layer 44 during the oxidation step. Although this embodiment discloses only a single 50 Å LV dry oxide layer 52 for simplicity of explanation, certain embodiments of the disclosed methods may readily be applied to double grown gate oxide thicknesses or a triple grown gate oxide thickness using additional masking and etching steps as known to those persons of ordinary skill in the art (and as further described below). Therefore, the thickness may be in a range of, for example, about 25 Å, about 50 Å, and about 100 Å to about 160 Å, etc., wherein the about 25 Å gate acts as a LV gate (e.g., less than about 1.8 V), the about 50 Å gate acts as a medium voltage gate (e.g., at about 2.5/3.3 V), and the about 100 Å to about 160 Å gate could function as a HV gate (e.g., at about 5 to about 16 V).

Figure 8A:
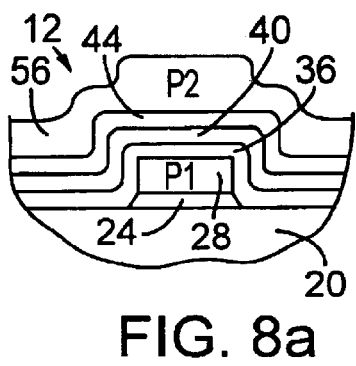
FIGS. 8a–8c illustrate polysilicon 2 gate deposition in the fabrication of double polysilicon stacked gate, polysilicon 1 transistor, and polysilicon 2 transistor regions of a flash memory device.
Figure 8B:
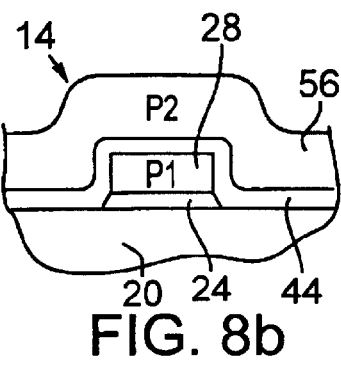
Figure 8C:
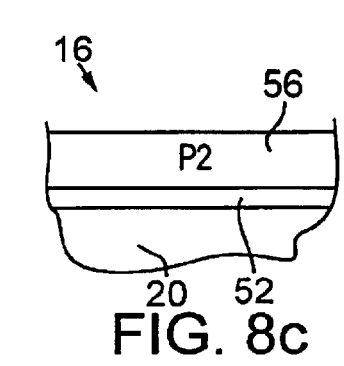
Figure 9C:
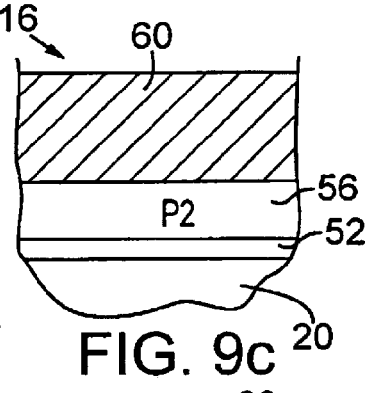
Figure 10C:
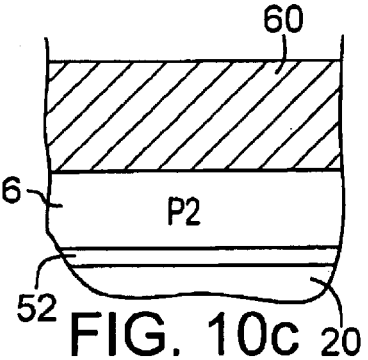

A poly 2 gate layer 56 is formed over all three regions, the double poly stacked gate region 12 (FIG. 8a), the poly 1 transistor region 14 (FIG. 8b), and the poly 2 transistor region 16 (FIG. 8c). A stacked gate mask (SGM) 60 is formed over the poly 1 portions 28 of the double poly stacked gate region 12 (FIG. 9a) and the poly 1 transistor region 14 (FIG. 9b). The SGM 60 is formed over the entire exposed portion of the poly 2 layer 56 on the poly 2 transistor region 16 (FIG. 9c). The poly 2 layer 56 is etched (a stacked gate etch or SGE) from the double poly stacked gate region 12 (FIG. 10a) and the poly 1 transistor region 14 (FIG. 10b). The entire poly 2 layer 56 remains on the poly 2 transistor region 16 (FIG. 10c). During this stacked gate etch, the length of the stacked gate 62 of the double poly stacked gate device as well as the length of the poly 1 gate 64 of the poly 1 transistor are defined.

Figure 11A:
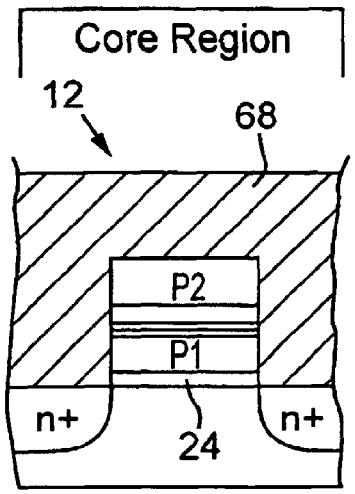
FIGS. 11a–11c illustrate a polysilicon 2 gate mask in the fabrication of double polysilicon stacked gate, polysilicon 1 transistor, and polysilicon 2 transistor regions of a flash memory device.
Figure 11B:
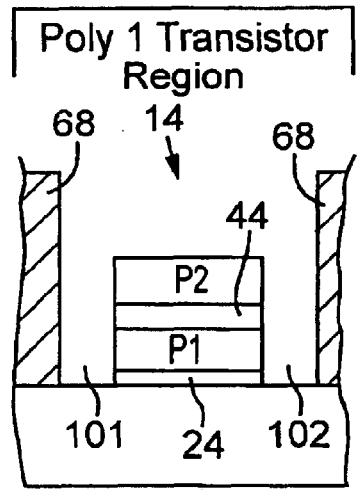
Figure 11C:
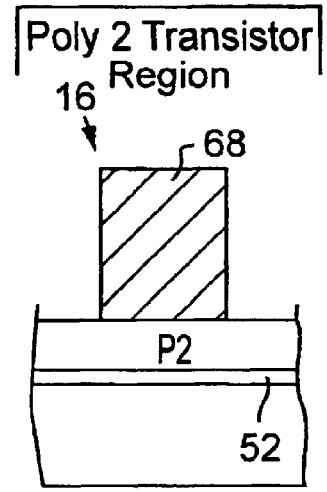

The double poly stacked gate region 12 undergoes conventional masking and ion implant to form a source (S) and drain (D) (see FIG. 11a). Specifically, during this ion implant step the poly 1 and poly 2 transistor regions 14, 16 are covered by masks so as not to undergo ion implant. Referring to FIGS. 11a–11c, a poly 2 mask 68 is formed over the entire double poly stacked gate region 12 (FIG. 11a) and over just a portion of the poly 2 transistor region 16 so as to define the length of a gate 72 of the poly 2 transistor. The transistor region 14 is opened up for poly 2 removal. In this region 14 the photoresist mask covers the majority of the S/D silicon surface, and the exposed portion (101, 102 in FIG. 11b) of the substrate includes a thin remaining screen oxide (not shown), e.g., about 35 Å in thickness. With sufficient etch selectivity of polysilicon to oxide, the remaining screen oxide prevents or minimizes S/D silicon surface gorging.

Figure 12A:
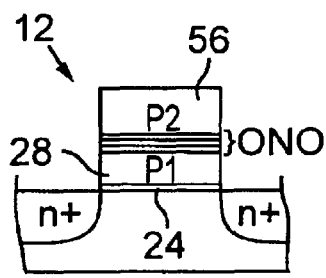
FIGS. 12a–12c illustrate a polysilicon 2 gate etching process in the fabrication of double polysilicon stacked gate, polysilicon 1 transistor, and polysilicon 2 transistor regions of a flash memory device.
Figure 12B:
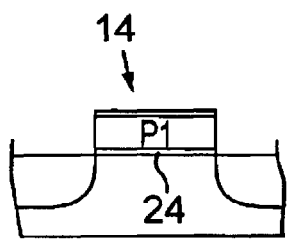
Figure 12C:
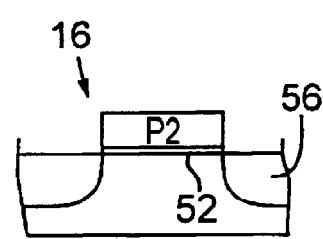
Figure 13A:
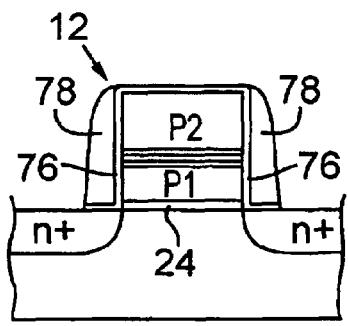
FIGS. 13a–13c illustrate side wall oxide formation, implant, and spacer deposition in the fabrication of double polysilicon stacked gate, polysilicon 1 transistor, and polysilicon 2 transistor regions of a flash memory device.
Figure 13B:
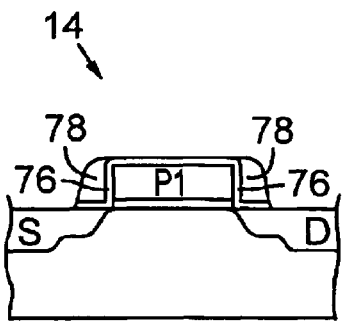
Figure 13C:
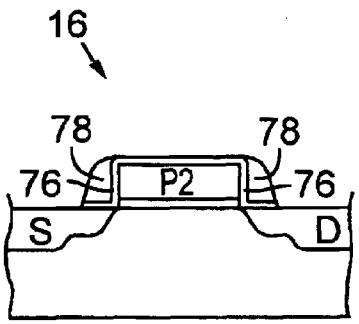

The poly 2 layer 56 is etched (FIGS. 12a–12c) forming the poly 2 gate 72 (FIG. 12c) and removing the poly 2 layer 56 from the poly 1 transistor region 14 (FIG. 12b). The poly 2 mask is removed. Referring to FIGS. 13a–13c, a poly re-oxidation process is performed to form side wall oxides 76. A layer of oxide 76 is also formed over the poly 2 gates in the stacked gate device as shown in FIG. 13a and poly 2 gate as shown in FIG. 13c.

The poly 1 and poly 2 transistor regions 14, 16 undergo light-doped drain (LDD) ion implant to form the PMOS and NMOS transistors. Spacer oxide or nitride (or other suitable material as known to those persons of ordinary skill in the art) may be deposited and etched to form spacers 78. The poly 1 and poly 2 transistor regions 14, 16 are ion implanted to form sources and drains S, D for the single polysilicon transistors 8, 10 (FIGS. 1b and 1c).

A conventional salicidation preclean process may be performed to remove any residual oxide overlying the poly gates and active regions. A conventional salicidation process may be performed followed by the conventional and desired backend processes as known to those persons of ordinary skill in the art. Thus, the double polysilicon stacked gate device 6 is formed as well as forming, at the same time, a salicided single polysilicon 1 transistor 8 and a salicided single polysilicon 2 transistor 10 (FIGS. 1a–1c). In addition, the poly 1 transistor 8 (FIG. 1b) has a tunnel oxidation formed under the gate and the transistor 8 is salicided with the poly 1 gate doped n+ for an NMOS and counter-doped p+ for a PMOS (assuming that the poly 1 was in-situ doped n-type). Accordingly, a new flash technology memory device having a salicided (or unsalicided if desirable) poly 1 transistor 8 (FIG. 1b) as well as a poly 2 only transistor 10 (FIG. 1C) is formed in a double stacked gate polysilicon device.

As stated above, conventional flash technology high-voltage, stacked-gate devices included poly 2 single transistors only (in addition to the stacked gate) or included only unsalicided poly 1 single transistors. Prior to this disclosure, in order to form a poly 1 device, the overlying poly 2 on the ONO/poly 1 or the HTO/poly 1 must first be removed. Because conventional etch technology does not include sufficient etch selectivity between poly and oxide, the removal of the poly 2 would also remove the majority of the poly 1 and the silicon S/D area. Although some newer flash technology etch methods include good selectivity, the poly 1 layer in such devices is a thin layer (i.e., less than about 1000 Å) for a reliable stacked gate mask and etch. Such a thin poly 1 gate cannot form a silicide (or self-aligned silicide) in a manufacturable manner. The present devices may include a poly 1 transistor having a gate thickness in a range of, e.g., from about 800–2000 Å, or greater than 1000 Å. Such poly 1 thickness is optimizable for both the stacked-gate etching and poly 1 transistor formation. That is, the poly 1 salicidation is optimized and the ion implant is prevented from going through the poly 1 gate and into the channel region thereunder. Thus, the new device may include a salicided poly 1 transistor and/or a poly 2 single gate transistor each formed with a stacked-gate transistor.

Not only does the thickness of the single poly 1 gate of certain embodiments of the disclosed device provide for optimizing salicidation and prevention of ion implant into the channel region, certain embodiments of the disclosed devices and formation schemes may provide for good etch selectivity between the poly and the oxide, the nitride and the oxide, and the oxide and the poly. That is, certain embodiments of the disclosed schemes allow such varied transistor formation because the stacked gate etching is a process that involves the poly 2 etch stopping at the oxide, oxide removal on nitride, nitride removal stopping on oxide, and oxide removal stopping on poly 1.

Certain embodiments of the disclosed devices and methods may also allow for fabrication of HV polysilicon 1 devices having gate oxide thicknesses other than the tunnel oxidation thickness disclosed by including additional gate oxide masks and etches. More specifically, prior to the tunnel oxidation step and the poly 1 gate deposition, a thicker stacked gate oxide may be formed for the double poly stacked gate device 6 and the poly 1 transistor device 8. First, a gate oxide layer is formed, the gate oxide is masked and etched. The devices are again oxidized to form a thicker stacked gate tunnel oxidation layer and a thinner (unstacked or single) gate oxide prior to the poly 1 gate deposition.

Whereas the invention has been described with reference to a variety of embodiments of the memory device and representative methods for fabricating the same, it will be understood that the invention is not limited to the disclosed embodiments and methods. On the contrary, the invention is intended to encompass all modifications, alternatives, and equivalents as may be included within the spirit and scope of the disclosure as defined by the appended claims. In addition, different embodiments of the disclosed devices and methods for forming the same may include different and varying device and method advantages.

What is claimed is:

1. A fabrication process for forming a flash memory cell, the method comprising:

providing a substrate;

forming a double polysilicon stacked gate device on the substrate, including a first polysilicon layer and a second polysilicon layer;

forming a high voltage MOS first transistor on the substrate, the high voltage MOS first transistor including a gate formed by the first polysilicon layer;

forming a MOS second transistor on the substrate, the MOS second transistor including a gate formed by the second polysilicon layer; and saliciding the double polysilicon stacked gate device, the high voltage MOS first transistor, and MOS second transistor, wherein the second polysilicon layer is formed over an intermediate high-temperature oxide (HTO) layer formed over the first polysilicon layer.

2. The fabrication process of claim 1, wherein the forming a high voltage first transistor comprises forming a NMOS transistor.

3. The fabrication process of claim 1, wherein the forming a high voltage first transistor comprises forming a PMOS transistor.

4. The fabrication process of claim 1, wherein the forming a second transistor comprises forming a low voltage NMOS transistor.

5. The fabrication process of claim 1, wherein the forming a second transistor comprises forming a low voltage PMOS transistor.

6. The fabrication process of claim 1, wherein the forming a second transistor comprises forming a high voltage transistor.

7. The fabrication process of claim 1, wherein the step of forming the gate of the high voltage MOS first transistor is performed at the same time the first polysilicon layer is formed for the double polysilicon stacked gate device.

8. A fabrication process for forming a flash memory device, the method comprising:

providing a substrate;

forming a double polysilicon stacked gate device on the substrate, including a first polysilicon layer and a second polysilicon layer;

forming a high voltage MOS first transistor on the substrate, the high voltage MOS first transistor including a gate formed by the first polysilicon layer; and forming a MOS second transistor on the substrate, the MOS second transistor including a gate formed by the second polysilicon layer, wherein the second polysilicon layer is formed over an intermediate high-temperature oxide (HTO) layer formed over the first polysilicon layer.

9. A fabrication process for forming a flash memory device, the method comprising:

providing a substrate;

forming a thin layer of tunnel oxide on the substrate;

depositing a first poly layer (poly 1) over the tunnel oxide layer;

depositing a poly mask and patterning the poly mask on a double poly stacked gate region on the substrate and on a poly 1 transistor region on the substrate;

removing the poly mask;

forming an insulation layer over the first poly layer;

depositing a silicon nitride layer over the insulation layer;

forming an oxide-nitride-oxide (ONO) mask on the nitride layer over an exposed poly 1 portion of the double poly stacked gate region;

removing exposed portions of the nitride layer and the insulation layer from the poly 1 transistor region and a poly 2 transistor region;

forming an HTO layer over the double poly stacked gate, the poly 1 transistor region, and the poly 2 transistor region;

forming a gate oxide mask (GOM) over the double poly stacked gate region and the poly 1 transistor region;

growing a LV dry oxide layer on the poly 2 transistor region;

forming a second poly layer (poly 2) over the double poly stacked gate region, the poly 1 transistor region, and the poly 2 transistor region;

forming a stacked gate mask (SGM) over a poly 1 gate of the double poly stacked gate region and the poly 1 transistor region;

etching the poly 2 layer from the double poly stacked gate region and the poly 1 transistor region;

forming a source and drain for the double poly stacked gate;

etching the poly 2 layer to form a poly 2 gate and to remove the poly 2 layer from the poly 1 transistor region; and ion implanting poly 1 and poly 2 transistor regions to form sources and drains for formation of single polysilicon gate transistors.

10. The method of claim 9 further including saliciding the poly 1 portion of the poly 1 transistor region.

* * * * *